(12) United States Patent
Hofmann et al.

(10) Patent No.: US 6,492,221 B1
(45) Date of Patent: Dec. 10, 2002

(54) DRAM CELL ARRANGEMENT

(75) Inventors: Franz Hofmann, Munich (DE); Josef Willer, Riemerling (DE); Till Schloesser, Munich (DE)

(73) Assignee: Infineon, AG, Munich (DE)

( * ) Notice: Subject to any disclaimer, the term of this patent is extended or adjusted under 35 U.S.C. 154(b) by 0 days.

(21) Appl. No.: 09/806,427

(22) PCT Filed: Sep. 15, 1999

(86) PCT No.: PCT/DE99/02939

§ 371 (c)(1),
(2), (4) Date: Jul. 3, 2001

(87) PCT Pub. No.: WO00/19528

PCT Pub. Date: Apr. 6, 2000

(30) Foreign Application Priority Data

Sep. 30, 1998 (DE) .......................... 198 45 004

(51) Int. Cl.⁷ .................... H01L 21/8244; H01L 27/108
(52) U.S. Cl. ................... 438/238; 438/239; 438/386; 438/399; 257/296; 257/305
(58) Field of Search .................. 438/155, 156, 438/242, 243, 248, 269, 238, 239, 250, 393, 386, 399; 257/296, 300, 302, 305, 398

(56) References Cited

U.S. PATENT DOCUMENTS

| | | | |
|---|---|---|---|
| 5,008,214 A | 4/1991 | Redwine | 438/243 |
| 5,571,730 A | 11/1996 | Park et al. | 438/269 |
| 6,172,391 B1 * | 1/2001 | Goebel et al. | 257/305 |
| 6,229,169 B1 * | 5/2001 | Hofmann et al. | 257/296 |
| 6,255,684 B1 * | 7/2001 | Roesner et al. | 257/302 |
| 6,309,930 B1 * | 10/2001 | Goebel et al. | 438/270 |

FOREIGN PATENT DOCUMENTS

| | | | |
|---|---|---|---|
| EP | 0 526 790 | 2/1993 | G11C/11/405 |
| JP | 62274771 | 11/1987 | H01L/27/10 |
| JP | 0 3019363 | 1/1991 | H01L/27/108 |

OTHER PUBLICATIONS

"Densest DRAM Cell" IBM Technical Disclosure Bulletin, vol. 32, No. 9A, pp. 380–382, Feb. 1990.

"Self–Aligned Polycide Bit Line Structure" IBM Technical Disclosure Bulletin, vol. 30, No. 12, pp. 109–110, May 1988.

* cited by examiner

Primary Examiner—Stephen D. Meier
Assistant Examiner—Maria Guerrero
(74) Attorney, Agent, or Firm—Fish & Richardson P.C.

(57) ABSTRACT

A dynamic random access memory includes memory cells arranged in rows and columns on the substrate and a plurality of connecting pillars, each associated with a memory cell. A bit line extends above the main area of the substrate and connects to each memory cell of a column. A first word line connects a first set of alternate memory cells of a row by a first subset of the plurality of connecting pillars. The first word line includes first parts arranged offset relative to the first subset of connecting pillars. A strip-shaped second part extends above the main area and adjoins the first parts of the first word line. A second word line connects to a second set of alternate memory cells of the row by a second subset of the connecting pillars. The second word line includes first parts arranged between mutually adjacent first word lines and offset from the second subset of the connecting pillars. Both the first and second word lines thus overlap but do not cover the connecting pillars. A strip-shaped second part extends above the main area in the first direction and adjoins the first parts of the second word line. The second part is above the first word line and the bit line.

14 Claims, 8 Drawing Sheets

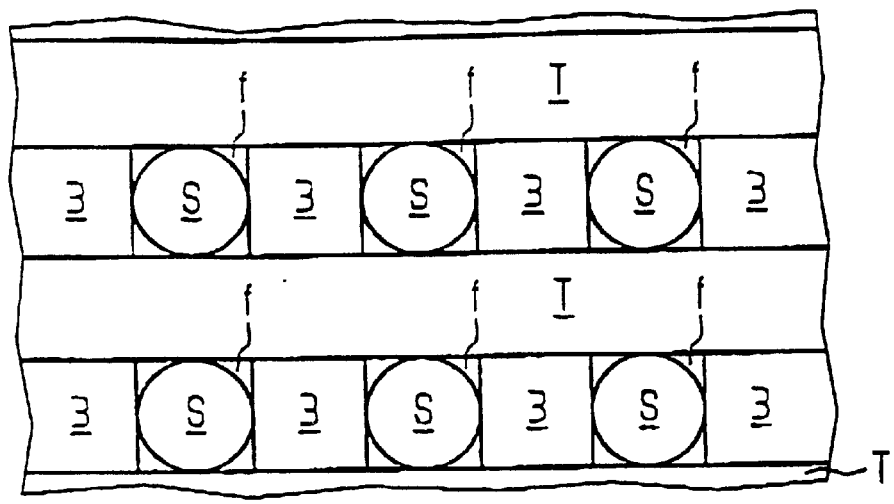
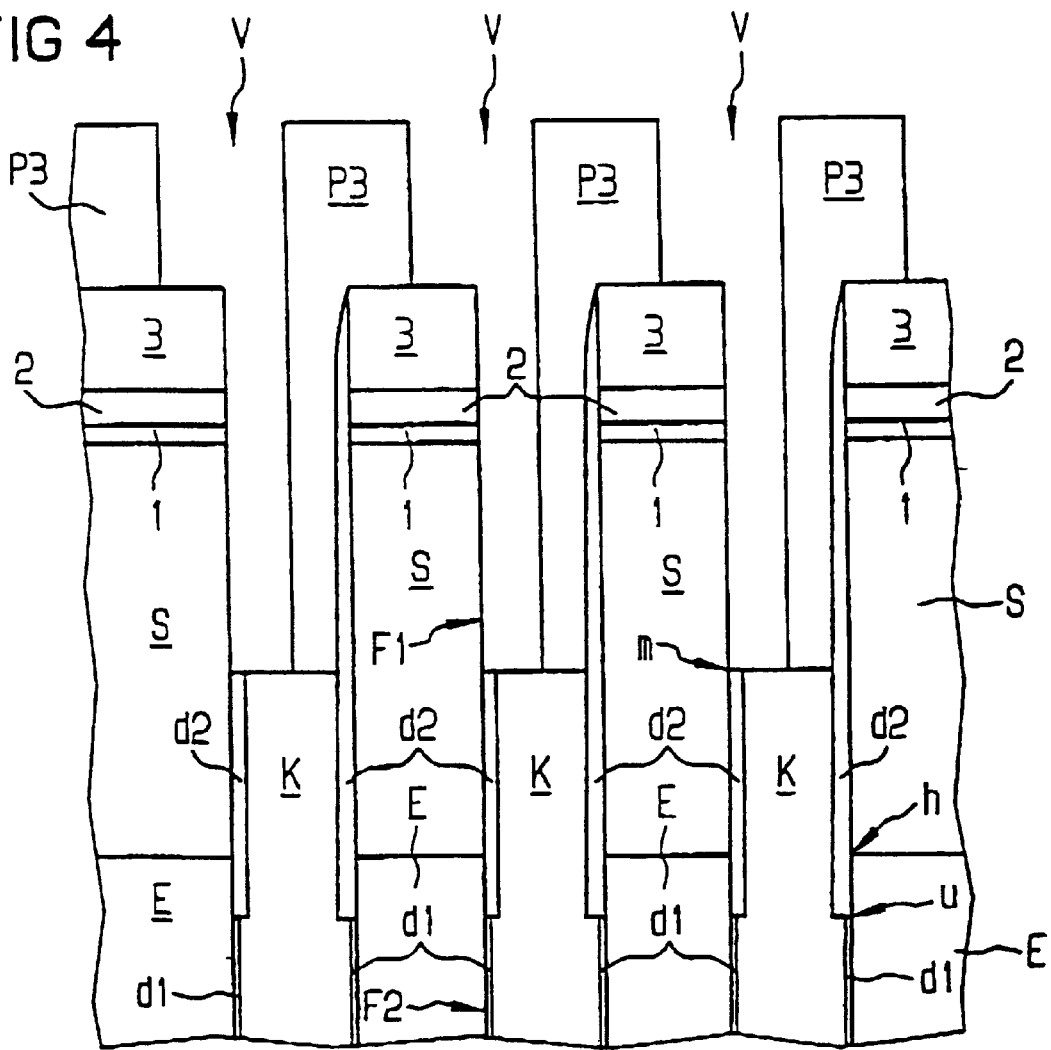

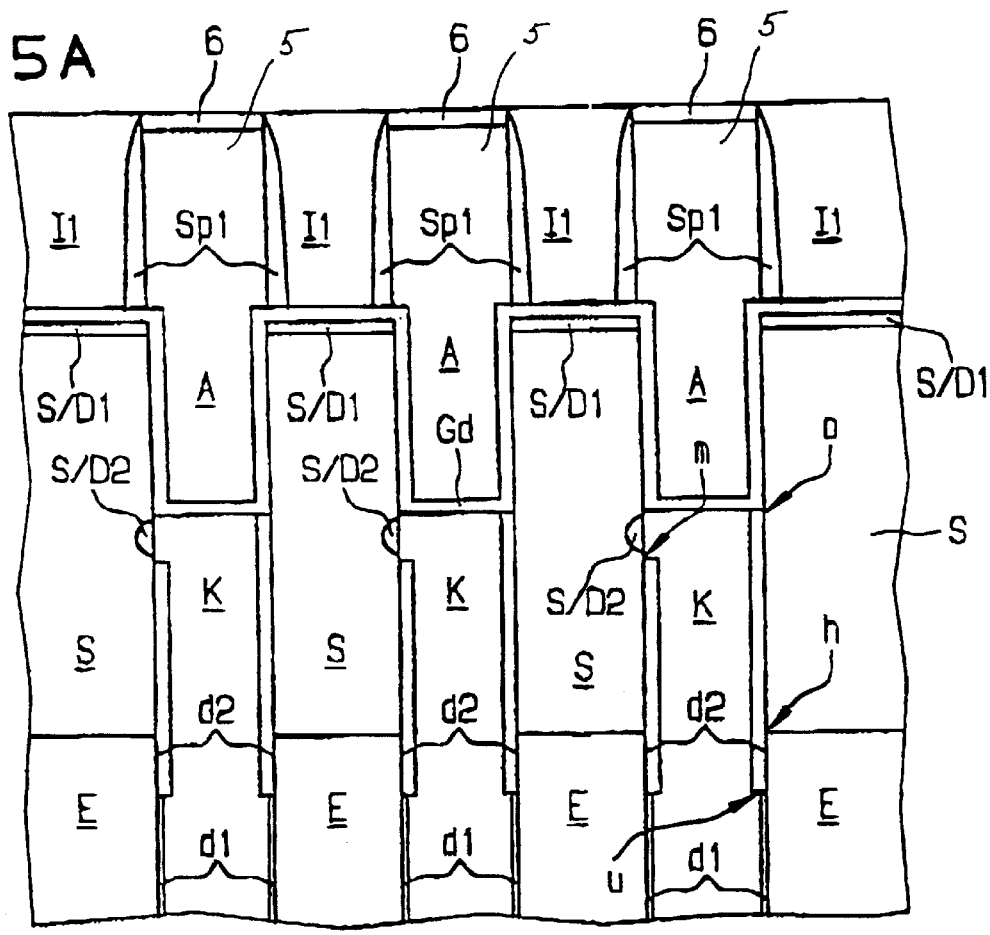
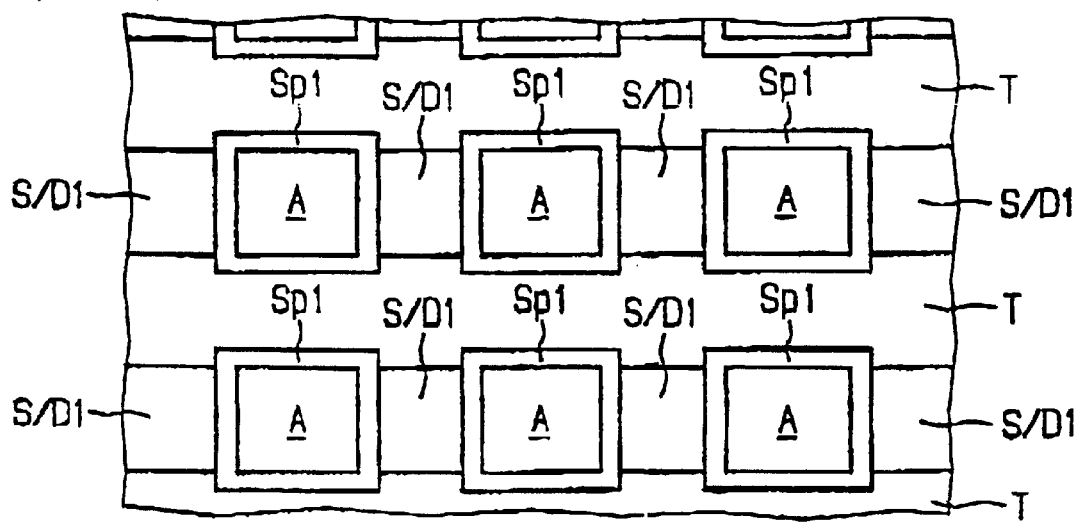

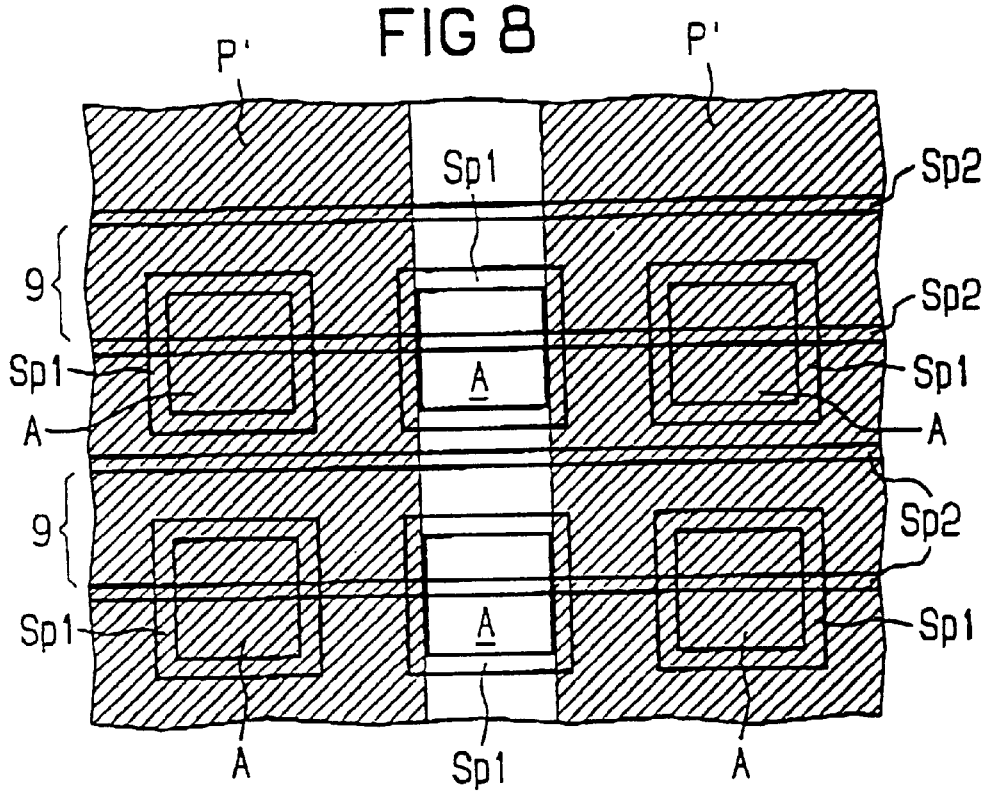
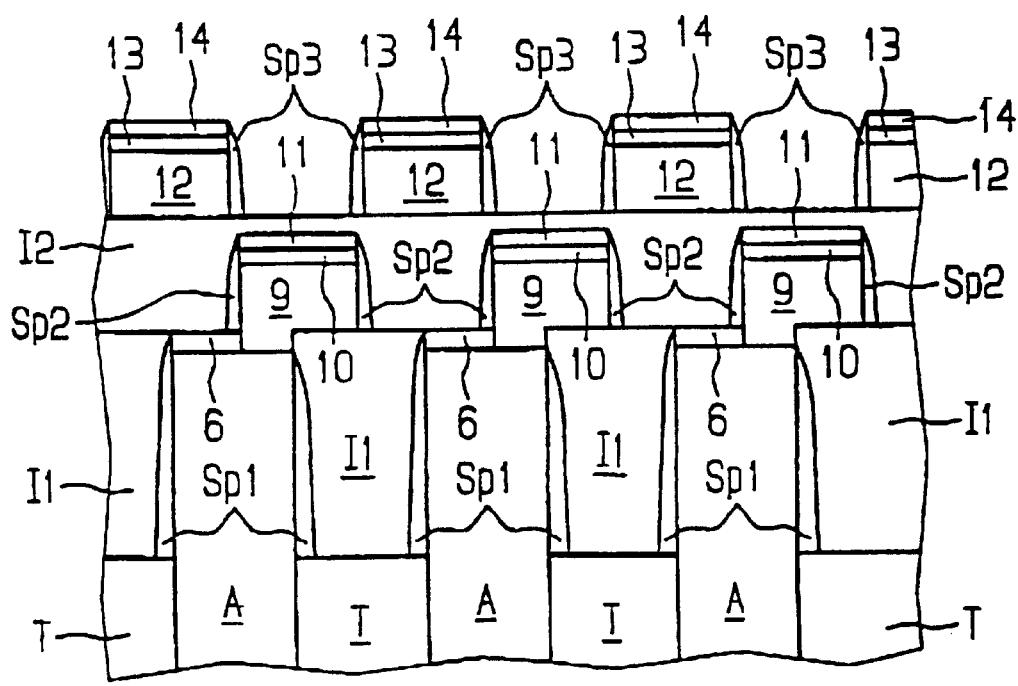

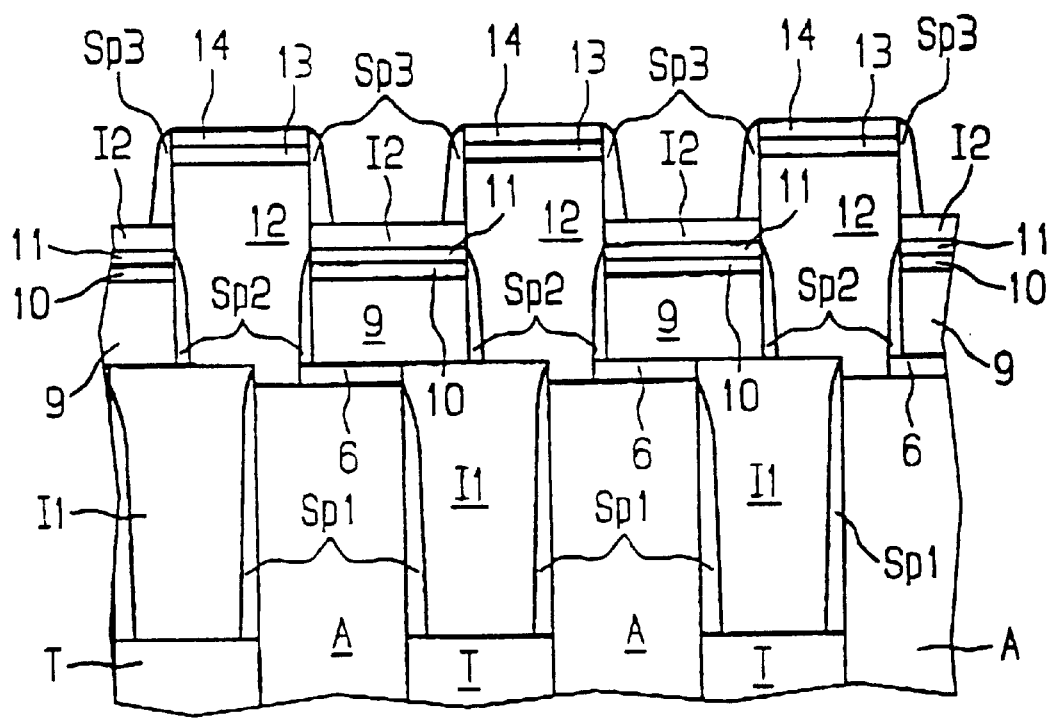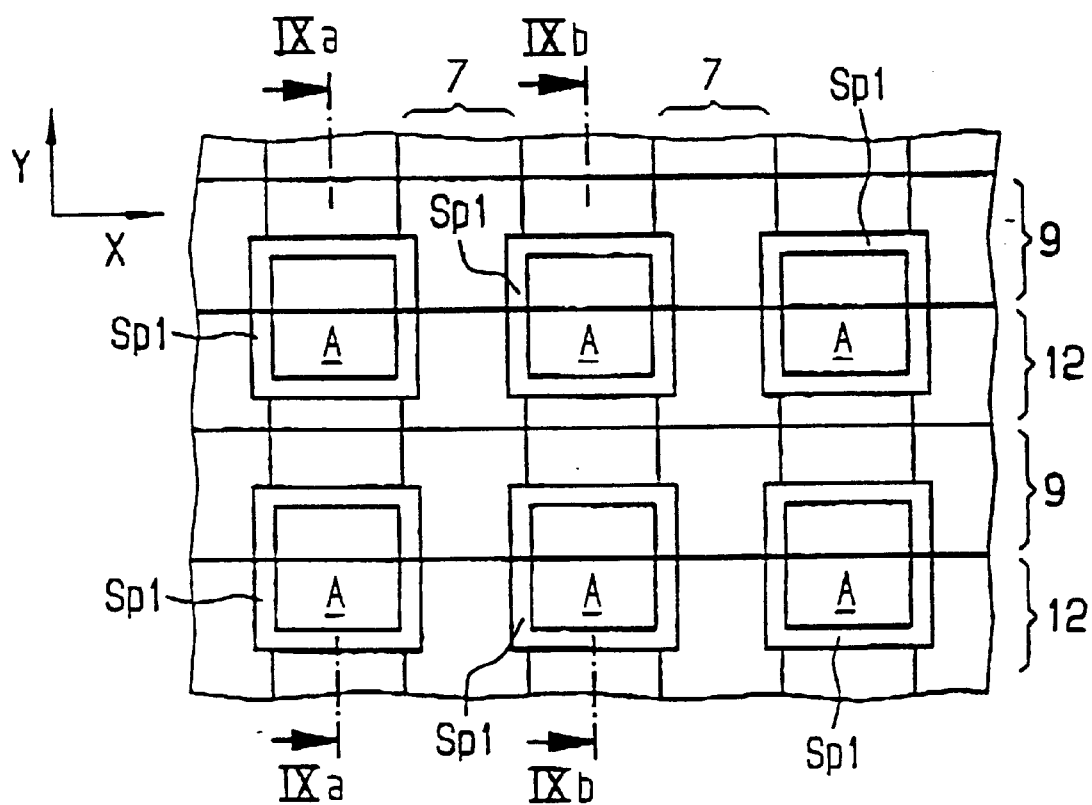

DRAM CELL ARRANGEMENT

The invention relates to a DRAM cell arrangement and a method for fabricating it.

BACKGROUND

Generally endeavors are made to produce a DRAM cell arrangement with an ever higher packing density. For a DRAM cell arrangement in which the information is stored in the form of a charge on a storage capacitor, the problem arises of producing the storage capacitor on a small area but nonetheless providing it with a sufficiently high capacitance in order that the signal of the charge is not submerged in background noise when the information is read out.

K. Hoffmann, "VLSI-Entwurf: Modelle und Schaltungen [VLSI Design: Models and Circuits]" (1996), pages 411 to 415 describes a DRAM cell arrangement having so-called folded bit lines. On account of comparable bulk resistances and coupling capacitances, the background noise of bit lines which are arranged close together is similar. In a DRAM cell arrangement having folded bit lines, the signal of a bit line which is connected to a storage capacitor to be read is compared with a signal of an adjacent bit line, which only comprises the background noise. Since the two bit lines are adjacent to one another, part of the background noise can thus be filtered out. Consequently, such a differential reading method makes it possible to read out a smaller charge, which produces a smaller voltage change on the bit line. A minimum capacitance of the storage capacitor required for reading out the information is smaller than in the case of a DRAM cell arrangement having so-called open bit lines, i.e. without folded bit lines. A word line which addresses the memory cell to be read must not be connected to any memory cell connected to the adjacent bit line, in order that the signal of the adjacent bit line only comprises background noise. In the case of the DRAM cell arrangement described, a memory cell comprises a transistor and a storage capacitor, which are arranged next to one another. A first word line and a second word line are arranged above the memory cell. Mutually adjacent memory cells along the word lines are alternately connected to the first word line and the second word line. To that end, the transistors and the storage capacitors of the memory cells are arranged in such a way that a transistor and a storage capacitor of different memory cells are alternately arranged next to one another along the word lines. The bit lines run transversely with respect to the word lines.

T. Ozaki et al., "0.228 $\mu m^2$ Trench Cell Technologies with Bottle-Shaped Capacitor for 1 Giga-Bit DRAMs," IEDM (1995) 661, describes a DRAM cell arrangement having open bit lines. A memory cell comprises a planar transistor and a storage capacitor connected in series therewith. Two planar transistors having a common source/drain region are arranged between two respective storage capacitors whose storage nodes are arranged in depressions in a substrate. In order to increase the capacitance of the storage capacitor, firstly an upper region of the depression is produced, the sidewalls of which region are provided with an oxide. Afterward, the oxide is removed at the bottom of the depression and the depression is deepened further, thereby producing a lower region of the depression. The lower region of the depression is widened by a wet etching process, with the result that a cross section of the lower region of the depression is larger than a cross section of the upper region. By virtue of the widening of the lower region of the depression, the surface area of a capacitor dielectric which covers areas of the depression is enlarged, and the capacitance of the storage capacitor is thus increased.

EP 0 852 396 describes a DRAM cell arrangement in which, in order to increase the packing density, a transistor of a memory cell is arranged above a storage capacitor of the memory cell. Active regions of the memory cells are in each case surrounded by an insulating structure arranged in a substrate. A depression is produced in the substrate for each memory cell, a storage node of the storage capacitor being arranged in the lower region of the depression and a gate electrode of the transistor being arranged in the upper region of the depression. An upper source/drain region, a channel region and a lower source/drain region of the transistor are arranged one above the other in the substrate. The lower source/drain region is connected to the storage node at a first sidewall of the depression. The insulating structure adjoins a second sidewall, opposite to the first sidewall, of the depression, with the result that the storage node does not adjoin the substrate there. A capacitor electrode of the storage capacitor is formed by the ad diffusion of dopant into the substrate. As in the publication by T. Ozaki et al. (see above), a lower region of the depression is widened in this case, too. A bit line adjoins the upper source/drain region and runs above the substrate. The gate electrode is insulated from the substrate and from the bit lines by a gate dielectric and the insulating structure. The gate electrode adjoins a word line running above the bit line.

SUMMARY

The invention is based on the problem of specifying a DRAM cell arrangement which has folded bit lines, whose word lines and bit lines can be produced with high electrical conductivity and which can, at the same time, be fabricated with a high packing density. Furthermore, the intention is to specify a method for fabricating it.

The problem is solved by means of a DRAM cell arrangement in which memory cells are arranged in columns which run parallel to a y-axis and rows which run parallel to an x-axis, in a substrate. The memory cells of a column are connected to a bit line which runs above a main area of the substrate. The memory cells of a row are alternately connected to a first word line and a second word line. Furthermore the memory cells each comprise a pillar-shaped connection structure. First parts of the first word line are each arranged offset in the y-direction, i.e. in the positive direction along the y-axis, with respect to one of the connection structures of the memory cells to which the first word line is connected, with the result that this connection structure is overlapped from above but not covered. A second part of the first word line is strip-shaped, runs above the main area and essentially parallel to the x-axis and adjoins the first parts of the first word line from above. Sidewalls of the first word line are provided with insulating spacers. First parts of the second word line are arranged between the spacers of mutually adjacent first word lines of the memory cells. The first parts of the second word line are each arranged offset oppositely to the y-direction, i.e. in the negative direction along the y-axis, with respect to one of the connection structures of the memory cells to which the second word line is connected, with the result that this connection structure is overlapped from above but not covered. A second part of the second word line is strip-shaped, runs above the main area and essentially parallel to the x-axis, adjoins the first parts of the second word line from above and is arranged above the first word line and the bit line. The first word line and the second word line overlap the row.

The problem is furthermore solved by means of a method for fabricating a DRAM cell arrangement, in which memory cells are produced in columns which run parallel to a y-axis and rows which run parallel to an x-axis. A pillar-shaped connection structure is in each case produced for the memory cells. Bit lines are produced which are respectively connected to the memory cells of a column. A first insulating layer is applied over the connection structures of memory cells. First contact holes are produced in the first insulating layer, which uncover parts of each second connection structure of the memory cells of a row in such a way that the first contact holes are arranged offset in the y-direction with respect to the connection structures. Conductive material is deposited, with the result that the first contact holes are filled with first parts of first word lines. A second insulating layer is deposited. The conductive material and the second insulating layer are patterned, thereby producing strip-shaped second parts of the first word lines, which run essentially parallel to the x-axis, adjoin the first parts of the first word line from above and are covered by the second insulating layer. Sidewalls of the first word lines are provided with insulating spacers. The first insulating layer is etched selectively with respect to the second insulating layer and the spacers, with the result that parts of the remaining connection structures are uncovered in such a way that second contact holes are produced, which are arranged offset oppositely to the y-direction with respect to the connection structures. Conductive material is deposited, with the result that the second contact holes are filled with first parts of second word lines, which are arranged between the spacers of mutually adjacent first word lines. The conductive material is patterned, thereby producing strip-shaped second parts of the second word lines, which run essentially parallel to the x-axis, adjoin the first parts of the second word lines from above and are arranged above the first word lines and the bit lines.

Materials having high electrical conductivities, such as e.g. WSi, TiSi, MoSi, CoSi, TaSi, are preferably deposited above a semiconductor substrate since, on the one hand, they cover edges formed e.g. by depressions in the semiconductor substrate poorly, i.e. non-uniformly, and, on the other hand, they should be arranged at a distance from the semiconductor substrate in order to avoid contamination of the semiconductor substrate. Moreover, mechanical strain or damage, caused by the deposition, of a surface of the substrate is thereby avoided. Since both the bit lines and the second parts of the first word lines and of the second word lines run above the substrate, they can contain materials having high electrical conductivities. Furthermore, the bit lines and the word lines can be produced at the same time as gate electrodes of transistors of a periphery of the DRAM cell arrangement by patterning a layer or a layer sequence made of conductive materials with the aid of a mask by means of etching. In this case, the bit lines and the word lines have a so-called planar construction.

Since the memory cells of a row are alternately connected to the first word line and the second word line, and the bit lines in each case connect the memory cells of a column to one another, there are no two memory cells which are connected to mutually adjacent bit lines and are simultaneously connected to the same word line. The DRAM cell arrangement consequently has folded bit lines.

The DRAM cell arrangement can have a high packing density since only the spacers, which can be fabricated with thin horizontal cross sections, i.e. cross sections parallel to the main area, laterally isolate the first word lines from the second word lines.

The bit lines and the word lines can be produced after the fabrication of the memory cells. This is advantageous since the production of the bit lines and word lines from metals is made possible, after the application of which process steps at high temperatures, which can lead for example to the contamination of other parts of the DRAM cell arrangement, are avoided. By way of example, a layer sequence comprising Ti, TiN and W can be patterned for the purpose of producing the word lines and the bit lines.

The production of the word lines is insensitive to alignment inaccuracies with regard to the connection structures. The extensive self-aligned contact-connection of the connection structures by the word lines enables the DRAM cell arrangement to have a high packing density. The alignment of photoresist masks for producing the first word lines and the second word lines merely has to guarantee that the connection structures are partially overlapped, since etching is effected selectively with respect to the spacers and the second insulating layer during the production of the second word lines, with the result that contact holes for the second word lines cannot be produced in and adjoining the first word lines. The alignment inaccuracy preferably amounts to up to a third of the width of the connection structures.

On account of the insensitivity to alignment inaccuracies, the DRAM cell arrangement can be produced with a high packing density. The first word lines preferably have a width equal to the minimum feature size F that can be fabricated in the technology used for fabricating the DRAM cell arrangement. The same applies to the second word lines, to distances between mutually adjacent first word lines, to distances between mutually adjacent second word lines and to the widths of the connection structures. The bit lines can likewise have a width and distances from one another which amount to F. Accordingly, in a plan view of the DRAM cell arrangement, the first word lines and the second word lines can be arranged alternately without a spacing directly next to one another or in an overlapping manner. The memory cell can be fabricated with an area of $4F^2$.

The connection structures can project above the main area of the substrate. In this case, sidewalls of the connection structures are provided with further insulating spacers between which first parts of the bit lines adjoin. Second parts of the bit lines are arranged between the first parts of the bit lines and have a larger width than the first parts of the bit lines. The bit lines adjoin the main area and in each case run between connection structures which are adjacent to one another in the x-direction. This has the advantage that the bit lines can be produced in a largely self-aligned manner between the connection structures. To that end, an insulation is produced which surrounds the connection structures provided with the further spacers. With the aid of a strip-shaped mask whose strips run parallel to the columns and which each overlap connection structures of memory cells of a column, trenches are produced in the insulation, etching being effected selectively with respect to the spacers and the first insulating layer. Afterward, conductive material is deposited and removed until the insulation is uncovered, with the result that the bit lines are produced in the trenches, and that the bit lines not overlapping the connection structures. This is advantageous since otherwise the effective cross section of the connection structures would be reduced, which would in turn result in a reduction in the overlap of the connection structures with the word lines.

It lies within the scope of the invention for a memory cell to comprise a transistor and a storage capacitor connected in series therewith.

In order to increase the packing density, it is advantageous if the transistor is configured as a vertical transistor, with the result that an upper source/drain region is arranged above a channel region and the channel region is arranged above a lower source/drain region of the transistor.

In order to further increase the packing density, it is advantageous if the transistor and the storage capacitor are arranged one above the other.

It lies within the scope of the invention for the upper source/drain region to be connected to the bit line. The connection structure is connected to a gate electrode of the transistor.

A depression may be provided for the memory cell in the substrate, a storage node of the storage capacitor being arranged in the lower region of the depression and the connection structure being arranged in the upper region of the depression. Areas of the lower region of the depression are provided with a capacitor dielectric. The storage node is electrically insulated from the connection structure. In the upper region of the depression, at least a first sidewall of the depression is provided with a gate dielectric. A part of the connection structure is arranged at least on the first sidewall and can act as a gate electrode of the transistor. The upper source/drain region is arranged on the main area of the substrate and adjoins two depressions that are adjacent to one another in the x-direction.

In order to produce such a DRAM cell arrangement, after the application of a capacitor dielectric, the depressions are filled with conductive material up to a middle height. To that end, the conductive material can be deposited, planarized by chemical mechanical polishing and then etched back as far as the middle height. Afterward, uncovered parts of the capacitor dielectric are removed, with the result that areas of the depressions are provided with the capacitor dielectric only up to the middle height. Afterward, the depressions are filled further by conductive material up to an upper height, which is situated in the lower region, with the result that the conductive material adjoins the substrate between the middle height and the upper height. The conductive material in the depressions forms the storage nodes. A gate dielectric is produced in such a way that it covers the storage node. As an alternative, firstly insulating material is applied to the storage node and the gate dielectric is grown subsequently. The connection structure is then produced in the upper region of the depression. The gate dielectric or the insulating material isolates the connection structure from the storage node.

It lies within the scope of the invention for the depression to be produced in a layer sequence, with the result that the lower source/drain region, the channel region and the upper source/drain region are produced from layers of the layer sequence.

The lower source/drain region is preferably produced by dopant diffusing from the storage node Abetween the upper height and the middle height into the substrate by means of a heat-treatment step. As a result, the lower source/drain region only adjoins a depression, with the result that channel regions of different transistors are electrically connected to one another. This is advantageous since floating body effects are avoided in this way.

It is advantageous to apply a mask prior to the removal of the uncovered parts of the capacitor dielectric above the middle height, which mask covers second sidewalls, opposite to the first sidewalls, of the depressions. As a result, the capacitor dielectric is preserved on the second sidewall, with the result that the storage node adjoins the substrate only at the first sidewall between the middle height and the upper height. The distance between the second sidewall and the first sidewall of mutually adjacent depressions can be reduced in this case without leakage currents arising between the associated storage nodes. The packing density of the DRAM cell arrangement can thus be increased. After the production of the storage nodes, uncovered parts of the capacitor dielectric which are arranged on the second sidewalls above the upper height can be removed.

The upper source/drain region can be produced by patterning a doped layer of the substrate, the layer adjoining the main area. The patterning is effected on the one hand by the production of the depressions. On the other hand, isolating structures are produced between upper source/drain regions that are adjacent to one another in the y-direction. The isolating structures can be produced by producing further trenches in the substrate, which run parallel to the rows and are arranged between the depressions. The further trenches are subsequently filled with insulating material.

The upper source/drain region can alternatively be produced by carrying out an implantation after the production of the depressions and isolating structures.

The depressions can be produced in a self-aligned manner between the isolating structures by producing the isolating structures and then etching the substrate with the aid of a strip-shaped mask selectively with respect to the isolating structures, strips of the mask running transversely with respect to the isolating structures.

In order to prevent a gate electrode of a depression from driving a transistor of the adjacent depression, it is advantageous if insulating structures which are thicker than the gate dielectric are arranged on the second sidewalls of the depressions. In order to increase the packing density, it is advantageous here if the insulating structures are arranged in the upper regions of the depressions instead of in the substrate. In order to produce the insulating structures, firstly the connection structures may be produced by producing the gate dielectric and then depositing conductive material and patterning it with the aid of a mask which covers the second sidewalls of the depressions. The connection structures are arranged on the first sidewalls of the depressions and do not completely fill the depressions. The insulating structures are produced by depositing insulating material and etching it back.

It is advantageous if the capacitor dielectric has a first part, which covers areas of the lower regions of the depressions up to a lower height, which lies below the middle height, and a second part, which is thicker than the first part and covers areas of the depressions between the lower height and the middle height. Depending on the conductivity types chosen, a pnp junction or an npn junction is formed by the lower source/drain region, the substrate and the capacitor electrode, which junction, driven by the storage node, can cause leakage currents. Thus, if the capacitor dielectric is particularly thick between the capacitor electrode and the second source/drain region, the storage node no longer drives the junction and leakage currents are avoided. To that end, after the production of the depressions, the first part of the capacitor dielectric is applied over the whole area. The depressions are filled by conductive material up to a lower height, which lies below the middle height. Uncovered parts of the first part of the capacitor dielectric are subsequently removed. The second part of the capacitor dielectric is firstly applied over the whole area and removed by anisotropic etching from a surface of the conductive material. The depression is filled further by the deposition of conductive material up to the middle height. The procedure may then continue in the manner described above.

A capacitor electrode of the capacitor is arranged in the substrate and adjoins the capacitor dielectric. The capacitor electrode may be configured as a doped substrate layer common to all of the capacitors. The doped layer may be produced e.g. by epitaxy or implantation prior to the production of the memory cells. As an alternative, a dopant source is introduced in the depressions, from which source dopant diffuses into the substrate, and forms the doped layer there, in a heat-treatment step.

The dopant source is e.g. arsenic glass. After the production of the depressions, the arsenic glass is deposited, with the result that areas of the depressions are covered. The lower regions of the depressions provided with the arsenic glass are filled with e.g. photoresist. Uncovered arsenic glass is subsequently removed. It is advantageous to grow a protective oxide after the removal of the photoresist. The protective oxide prevents arsenic from evaporating during the subsequent heat-treatment step during which arsenic diffuses from the arsenic glass into the substrate. The capacitor electrode is produced as an arsenic-doped part of the substrate which surrounds the lower regions of the depressions.

It is advantageous if the first sidewall is plane in the upper region and the area of the lower region is curved. The growth of the gate dielectric produced by thermal oxidation depends on the orientation of the first sidewall relative to the crystal structure of the substrate. If the first sidewall is plane, the gate dielectric can grow homogeneously since a plane area, in contrast to a curved area, has a defined orientation relative to the crystal structure. Control characteristics of the transistor in which the gate dielectric has a homogeneous thickness correspond to those of conventional planar transistors and have a particularly high subthreshold transconductance. If a part of the capacitor dielectric is grown by thermal oxidation on an area having an edge, the oxide turns out to be particularly thin on the edge. It is therefore possible for leakage currents to arise in the region of the edge. Therefore, it is advantageous if the capacitor dielectric is produced on an area having no edges. Even if the capacitor dielectric is produced by depositing material, edges in the area have a disadvantageous effect since field distortions occur at the edges and can reduce the breakdown voltage of the capacitor.

It lies within the scope of the invention for the upper region to have an essentially rectangular cross section which is larger than a cross section of the lower region, which is essentially circular or elliptic. To that end, after the production of the upper regions of the depression, auxiliary spacers are produced on the depressions by depositing material and anisotropically etching it back. The auxiliary spacers are rounded by an isotropic etching process, with the result that uncovered parts of bottoms of the depressions have a circumference without corners. The lower regions of the depressions are subsequently produced by anisotropic etching selectively with respect to the auxiliary spacers.

In order to increase the capacitance of the storage capacitor, it is advantageous if the lower region of the depression is subsequently extended by isotropically etching the substrate, with the result that its cross section is enlarged. This enlarges the area of the lower region on which the capacitor dielectric is arranged, with the result that the capacitance of the storage capacitor is increased.

A method is described below which prevents the situation where, on account of the finite selectivity of etching processes, an upper area of the isolating structures lies below the main area after the production of the depressions. Prior to the production of the isolating structures, a lower layer made of a first material is applied on the main area and an upper layer made of a second material is applied over the lower layer. The isolating structures are subsequently produced, the first material being used to fill the further trenches. An upper area of the isolating structures lies above the main area but below an upper area of the lower layer. By depositing and planarizing the second material until the lower layer is uncovered, auxiliary structures made of the second material are produced above the isolating structures. Afterward, the depressions are produced with the aid of the strip-shaped mask by firstly etching the first material selectively with respect to the second material, with the result that the upper area of the isolating structures lies above the main area in an unchanged manner, since the auxiliary structures protect the isolating structures. The depressions can subsequently be produced by etching uncovered parts of the substrate, the isolating structures and the lower layer serving as mask. In this case, on account of the finite selectivity of the etching process, the isolating structures and the lower layer are removed whose upper areas do not lie below the main area on account of the sufficient thickness of the lower layer after the production of the depressions.

The substrate may contain silicon and/or germanium and is preferably monocrystalline in order that the gate dielectric can be produced by thermal oxidation.

The bit lines and the word lines may be constructed in a multilayer manner. By way of example, it is possible to provide in each case a lower layer made of doped polysilicon and, above that, a layer made of a material having better electrical conductivity, e.g. silicide or metal.

An exemplary embodiment of the invention is explained in more detail below with reference to the figures.

BRIEF DESCRIPTION OF THE FIGURES

FIG. 2b shows a cross section, perpendicular to the cross section from FIG. 1a, through the substrate after the process steps from FIG. 2a.

FIG. 3 shows the plan view from FIG. 2a after the auxiliary spacers have been rounded.

FIG. 4 shows the cross section from FIG. 2b after a lower region of the depression, a capacitor dielectric, a storage node and a third photoresist mask have been produced.

FIG. 5a shows the cross section from FIG. 4 after the storage node has been enlarged and upper source/drain regions and lower source/drain regions of transistors, a gate dielectric, connection structures, a sixth layer, first spacers and a first insulation have been produced.

FIG. 5b shows the plan view from FIG. 2a illustrating the connection structures, the first spacers, the upper source/drain regions and the isolating structures.

FIG. 8 shows the plan view from FIG. 2a illustrating the connection structures, the first spacers, the ninth layer, the second spacers and an eighth photoresist mask.

FIG. 9a shows the cross section from FIG. 7a after a twelfth layer and a thirteenth layer which form second word lines, a fourteenth layer and third spacers have been produced.

FIG. 9b shows a cross section, parallel to FIG. 9a, through the substrate after the process steps from FIG. 9a.

FIG. 9c shows the plan view from FIG. 2a illustrating the connection structures, the first spacers, the seventh layer, the ninth layer and the twelfth layer.

The figures are not true to scale.

DETAILED DESCRIPTION

Figure 1:
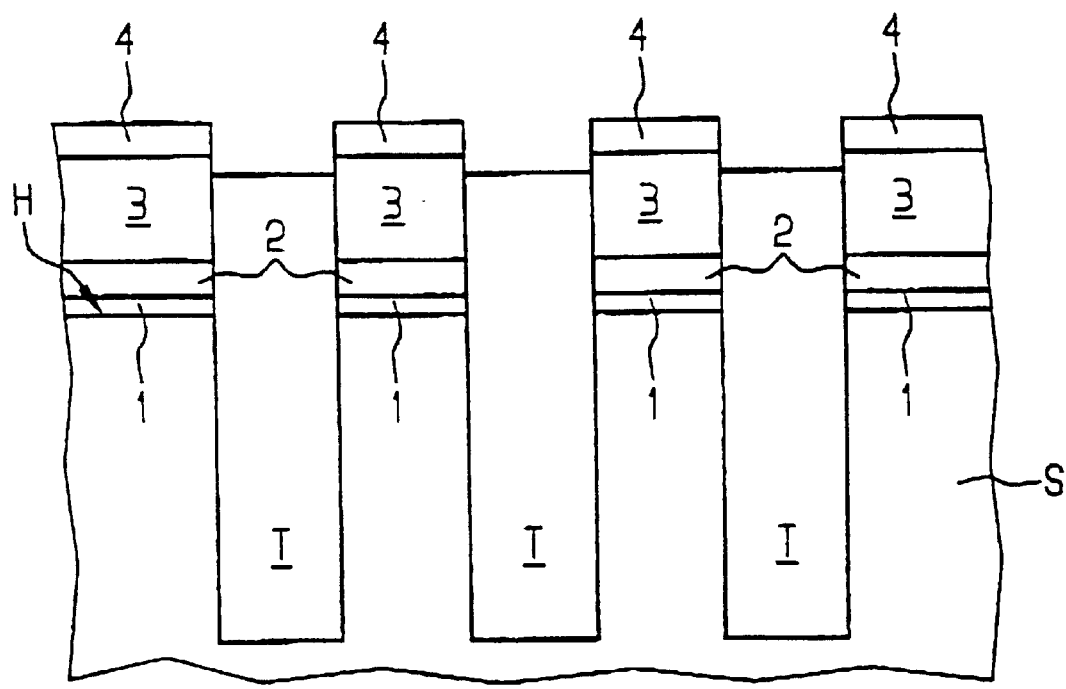
FIG. 1a shows a cross section through a substrate after a first layer, a second layer, a third layer, a fourth layer and isolating structures have been produced.
FIG. 1b shows the cross section from FIG. 1a after the fourth layer has been removed and auxiliary structures have been produced.
Figure 1:
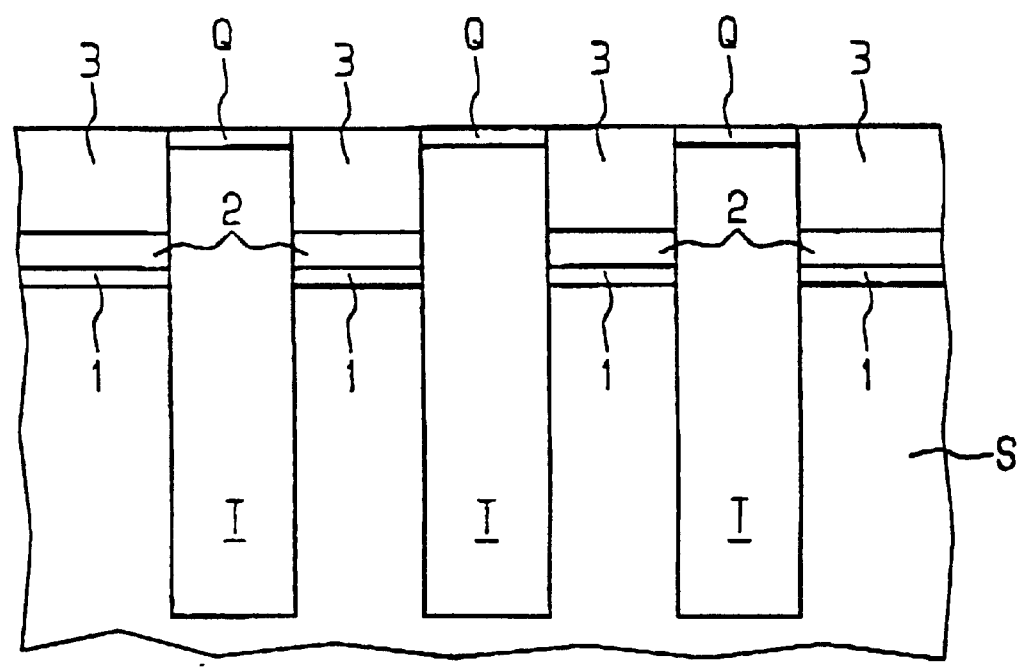

In an exemplary embodiment, a p-doped substrate S made of silicon is provided as the starting material, which is p-doped with a dopant concentration of approximately $10^{18}$ cm$^{-3}$ in a layer adjoining a main area H of the substrate S. There is deposited on the main area H a first layer 1 made of SiO$_2$ and having a thickness of approximately 20 nm, over that a second layer 2 made of silicon nitride and having a thickness of approximately 100 nm, over that a third layer 3 made of SiO$_2$ and having a thickness of approximately 800 nm, and over that a fourth layer 4 made of silicon nitride and having a thickness of approximately 100 nm (see FIG. 1a).

With the aid of a strip-shaped first photoresist mask (not illustrated), the fourth layer 4, the third layer 3, the second layer 2, the first layer 1 and the substrate S are etched anisotropically, with the result that first trenches produced in the substrate S have a depth of approximately 300 nm, a width of approximately 100 nm and distances of approximately 100 nm between one another. Suitable etchants are, for example, CF$_4$, CHF$_3$, C$_2$F$_6$ and HBr, which are combined in accordance with the material to be etched.

Isolating structures T are produced in the first trenches by SiO$_2$ being deposited conformally to a thickness of approximately 200 nm and being planarized by chemical mechanical polishing until an upper area of the fourth layer 4 is uncovered. Afterward, SiO$_2$ is etched back selectively with respect to the silicon nitride, with the result that an upper area of the isolating structures T lies below an upper area of the third layer 3 (see FIG. 1a).

Afterward, silicon nitride is deposited and planarized by chemical mechanical polishing until the upper area of the third layer 3 is uncovered. In this way, auxiliary structures Q made of silicon nitride are arranged above the isolating structures T (see FIG. 1b).

With the aid of a strip-shaped second photoresist mask P2 (see FIG. 2a) whose strips run transversely with respect to the strips of the first photoresist mask, SiO$_2$ is etched selectively with respect to silicon nitride, using C$_4$F$_6$, CO, for example, until the second layer 2 is partially uncovered. Silicon nitride is subsequently etched, with the result that the auxiliary structures Q and uncovered parts of the second layer 2 are removed. By etching silicon selectively with respect to SiO$_2$, on account of the finite selectivity of the etching process, firstly the first layer 1 is partially cut through and then upper regions of depressions V are produced. In this case, the isolating structures T and the third layer 3 act as a thick mask. The upper regions of the depressions V have a depth of approximately 300 nm in the substrate S and have cross sections parallel to the main area H which are square and whose dimensions are approximately 100 nm. Distances between mutually adjacent depressions V are approximately 100 nm between one another (see FIGS. 2a and 2b).

Figure 2A:
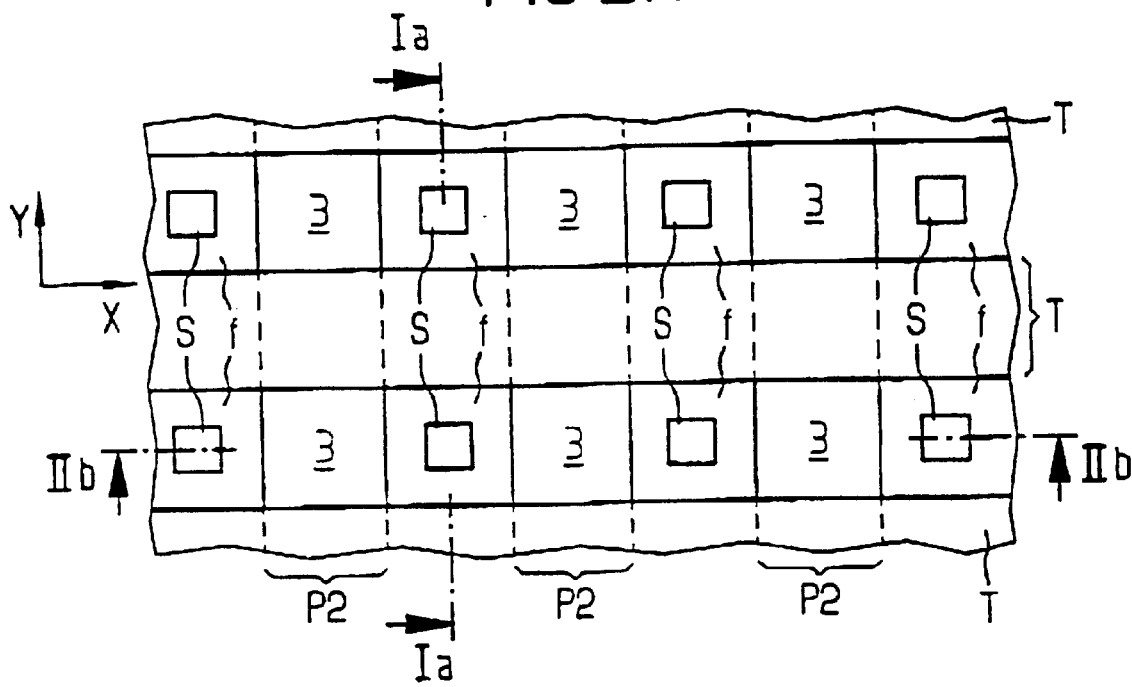
FIG. 2a shows a plan view of the substrate from FIG. 1b after upper regions of depressions and auxiliary spacers have been produced. Furthermore, the position of a second photoresist mask is illustrated.
Figure 2B:
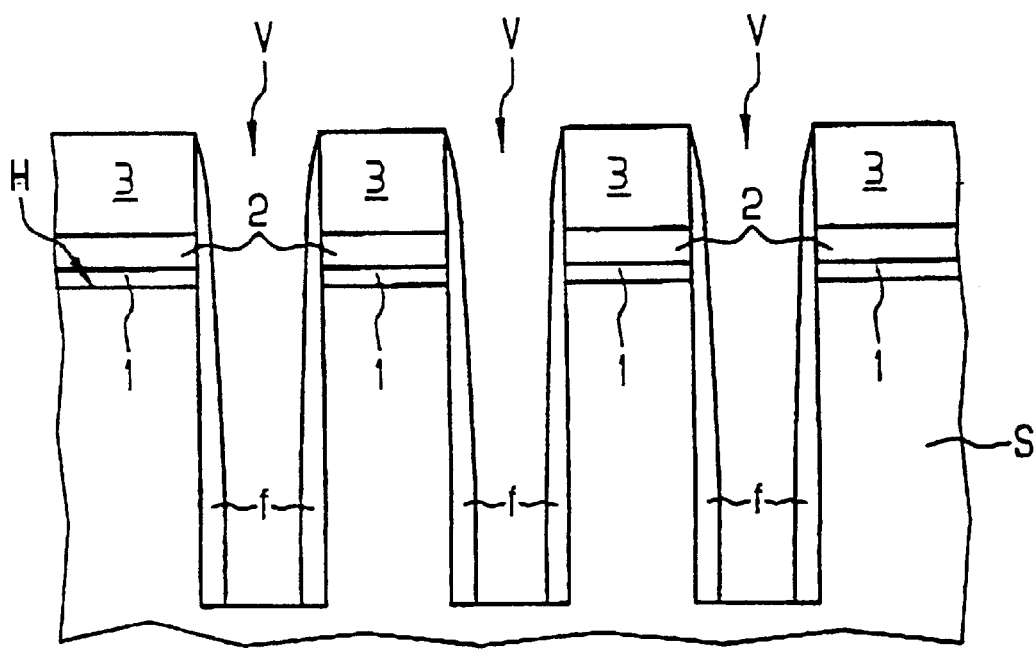

Auxiliary spacers F are produced in the depressions V by SiO$_2$ being deposited to a thickness of approximately 30 nm and etched back anisotropically (see FIGS. 2a and 2b). Uncovered parts of the bottoms of the depressions are essentially square and have a side length of approximately 40 nm.

For the rounding of the auxiliary spacers f, isotropic etching back is subsequently carried out using CF$_4$, for example, as etchant (see FIG. 3). Uncovered parts of the bottoms of the depressions V are essentially circular and have a diameter of approximately 100 nm.

Afterward, silicon is anisotropically etched selectively with respect to SiO$_2$ using HBr, for example, thereby producing lower regions of the depressions V which, on account of the auxiliary spacers f acting as mask, have circular horizontal cross sections. The depressions V now have a depth of approximately 7 µm (see FIG. 4). The isolating structures T and the third layer 3 act as a thick mask during the etching process.

The upper regions of the depressions V each have four lateral plane first areas F1. The lower regions of the depressions V have a curved second area F2. A horizontal cross section, i.e. a cross section parallel to the main area H, of the lower region of one of the depressions V has a curved circumference. A part of the substrate S is arranged, in particular, under corners of the upper regions of the depressions V since the auxiliary spacers f cover at least the corners and, consequently, deeper etching is not effected there.

In order to produce a capacitor electrode E of capacitors, arsenic glass is deposited to a thickness of approximately 10 nm. The depressions V provided with the arsenic glass are filled with photoresist up to a height h of approximately 1 µm below the main area H (cf. FIG. 4). Uncovered arsenic glass is subsequently removed. After the removal of the photoresist, a protective oxide (not illustrated) is grown. The protective oxide prevents arsenic from evaporating during a subsequent heat-treatment step at approximately 1000° C. during which arsenic diffuses from the arsenic glass into the substrate S. As a result, the capacitor electrode E is produced as an arsenic-doped part of the substrate S which surrounds parts of the lower regions of the depressions V (see FIG. 4). The protective oxide and the auxiliary spacers f are subsequently removed using dilute hydrofluoric acid.

In order to produce a first part d1 of a capacitor dielectric, areas of the depressions V are provided with silicon nitride which is subsequently partially oxidized, with the result that the first part d1 of the capacitor dielectric is produced as a so-called NO layer having an approximately 3 nm oxide-equivalent thickness (see FIG. 4).

In order to produce storage nodes K of the capacitors, in-situ-doped polysilicon is deposited to a thickness of approximately 100 nm and planarized by chemical mechanical polishing until the second layer 2 is uncovered. In the process, the third layer 3 is removed and the isolating structures T are removed somewhat. Afterward, the polysilicon is etched back by anisotropic etching down to a depth of 1.1 μm below the main area H, with the result that the depressions V are filled with polysilicon up to a lower height u (see FIG. 4). Uncovered parts of the first part d1 of the capacitor dielectric are removed using hydrofluoric acid, for example.

In order to produce a spacer-type second part d2 of the capacitor dielectric in the depressions V, $SiO_2$ is deposited to a thickness of approximately 15 nm and etched back anisotropically (see FIG. 4). The second part d2 of the capacitor dielectric is thicker than the first part d1.

The storage nodes K are enlarged by depositing in-situ-doped polysilicon to a thickness of approximately 100 nm and subsequently etching it back down to a depth of approximately 250 nm below the main area H. The depressions V are filled with polysilicon up to a middle height m (see FIG. 4).

With the aid of a multilayer third photoresist mask P3 (see FIG. 4), parts of the second part d2 of the capacitor dielectric are removed. On first sidewalls of the depressions V, the second part d2 of the capacitor dielectric extends only from the lower height u up to the middle height m.

Afterward, in-situ-doped polysilicon is deposited to a thickness of approximately 100 nm and planarized by chemical mechanical polishing until the second layer 2 is uncovered.

Below the first layer 1, upper source/drain regions S/D1 of vertical transistors are produced by implantation with n-doping ions in the substrate S. These source/drain regions have a thickness of approximately 30 nm. On account of the isolating structures T and the depressions V, the upper source/drain regions S/D1 have square horizontal cross sections with a side length of approximately 100 nm. Mutually adjacent upper source/drain regions S/D1 are isolated from one another by the isolating structures T or by the depressions V.

The polysilicon is subsequently etched back down to a depth of approximately 200 nm below the main area H, with the result that the storage nodes K are thickened further. The depressions V are filled with polysilicon up to an upper height H (see FIG. 5a). The storage nodes K adjoin the substrate S at the first sidewalls of the depressions V between the middle height m and the upper height o. Upper parts of the storage nodes K are arranged in the upper regions of the depressions V. By means of a heat-treatment step, dopant diffuses from the storage node K into the substrate S, thereby producing lower source/drain regions S/D2 of the transistors, which adjoin the first sidewalls of the depressions V in the region between the middle height m and the upper height o.

The second layer 2 is subsequently removed using, for example, hot phosphoric acid as etchant.

By means of thermal oxidation, a gate dielectric Gd is produced on sidewalls of the upper regions of the depressions V, on the main area H and on the storage nodes K (see FIG. 5a).

A fifth layer 5 made of in-situ-doped polysilicon is subsequently deposited to a thickness of approximately 60 nm, thereby filling the upper regions of the depressions V. A sixth layer 6 made of silicon nitride and having a thickness of approximately 100 nm is deposited over it.

Afterward, with the aid of a fourth photoresist mask, which does not cover the depressions V, the sixth layer 6 and the fifth layer 5 are patterned, with the result that connection structures A are produced from the fifth layer in the upper regions of the depressions V. These connection structures project approximately 200 nm above the main area H and are covered by the sixth layer 6 (see FIGS. 5a and 5b). The connection structures A have square horizontal cross sections with a side length of approximately 100 nm.

In order to produce first spacers Sp1 on sidewalls of the connection structures A, silicon nitride is deposited to a thickness of approximately 20 nm and etched back until the gate dielectric Gd on the main area H is uncovered. Through conformal deposition of $SiO_2$ to a thickness of approximately 200 nm and chemical mechanical polishing until the sixth layer 6 is uncovered, a first insulation I1 is produced which surrounds the connection structures A provided with the first spacers Sp1 (see FIG. 5a).

Figure 6A:
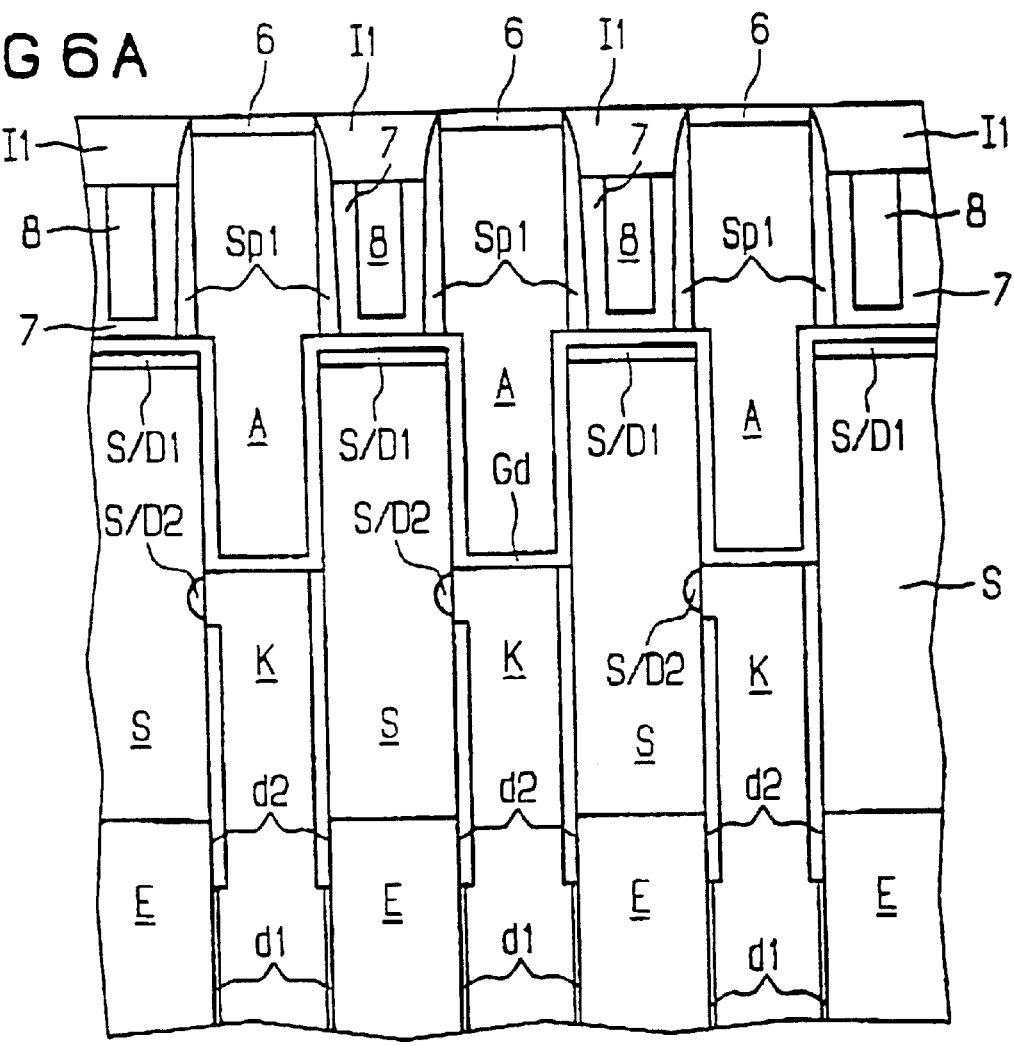
FIG. 6a shows the cross section from FIG. 5a after a seventh layer and an eighth layer, which form bit lines, have been produced.
Figure 6B:
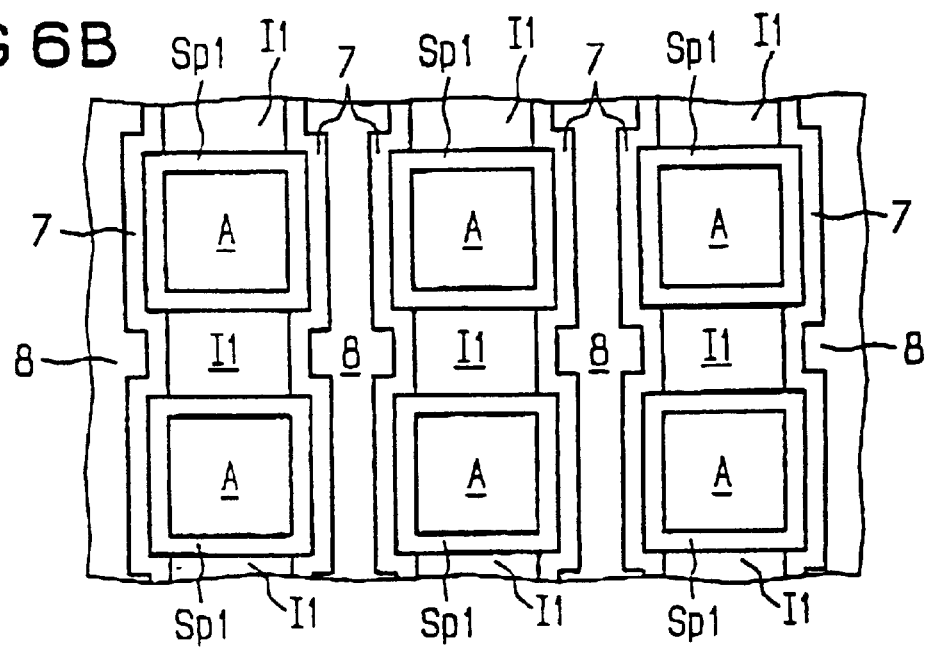
FIG. 6b shows the plan view from FIG. 2a illustrating the connection structures, the first spacers, parts of the first insulation which are not arranged above the bit lines, parts of the seventh layer which are not arranged below the eighth layer, and the eighth layer.

With the aid of a strip-shaped fifth photoresist mask (not illustrated) whose strips run transversely with respect to the isolating structures T, have a width of approximately 100 nm and a distance of approximately 100 nm between one another and at least partially overlap the connection structures, $SiO_2$ is etched selectively with respect to silicon nitride, with the result that strip-shaped second trenches are produced in the first insulation I1 until parts of the main area H are uncovered. In the strip-shaped second trenches, the bit lines are produced by depositing an n-doped seventh layer 7 made of doped polysilicon and having a thickness of approximately 15 nm. Afterward, an eighth layer 8 made of tungsten silicide is deposited to a thickness of approximately 60 nm, thereby filling the strip-shaped second trenches, and planarized by chemical mechanical polishing until the sixth layer 6 is uncovered. The bit lines are formed by the seventh layer 7 and the eighth layer 8 (see FIG. 6a). As a result of etching-back, an upper area of the bit lines lies below an upper area of the first insulation I1. By means of a subsequent heat-treatment step at approximately 800° C., dopant is activated in the seventh layer 7. The bit lines have first parts which adjoin between the first spacers Sp1 of mutually adjacent connection structures A and have a width of approximately 60 nm. Second parts of the bit lines are arranged between the first parts of the bit lines and have a width of approximately 100 nm (see FIG. 6b). The sensitivity to alignment inaccuracies for the production of the bit lines between the connection structures A is low since etching is effected selectively with respect to the first spacers Sp1 and with respect to the sixth layer 6.

Afterward, $SiO_2$ is deposited and planarized by chemical mechanical polishing until the sixth layer 6 is uncovered. In the process, the first insulation I1 is extended in such a way that it covers the bit lines (see FIG. 6a)

With the aid of a sixth photoresist mask, which does not cover regions a of the connection structures A (see FIG. 7b), first contact holes are produced in the sixth layer 6, which contact holes uncover parts of each second connection structure A of the memory cells of a row in such a way that the first contact holes are arranged offset in the y-direction with respect to the connection structures A. In this case, etching is effected selectively with respect to the first insulation I1 and with respect to silicon using e.g. $CHF_3$ as etchant.

In order to produce first word lines, an in-situ-doped ninth layer 9 made of polysilicon and having a thickness of approximately 60 nm is deposited and a tenth layer 10 made of tungsten silicide and having a thickness of approximately 50 nm is deposited over that. An insulating eleventh layer 11 made of $SiO_2$ and having a thickness of approximately 50 nm is deposited over the tenth layer 10. The first contact holes are thereby filled with conductive material. With the aid of a strip-type seventh photoresist mask, whose strips run parallel to the isolating structures T, have a width of approximately 100 nm and distances of approximately 100 nm between one another and at least partially overlap the first contact holes, the eleventh layer 11, the tenth layer 10 and the ninth layer 9 are patterned until the first insulation I1 is uncovered. The first word lines are formed by the ninth layer 9 and the tenth layer 10 (see FIG. 7*a*).

The first word lines have first parts which are arranged in the first contact holes and adjoin second parts of the first word lines which have strip-shaped cross sections.

Second spacers Sp2 are produced on sidewalls of the second parts of the first word lines by depositing $SiO_2$ to a thickness of approximately 18 nm and subsequently etching it back.

Figure 7A:
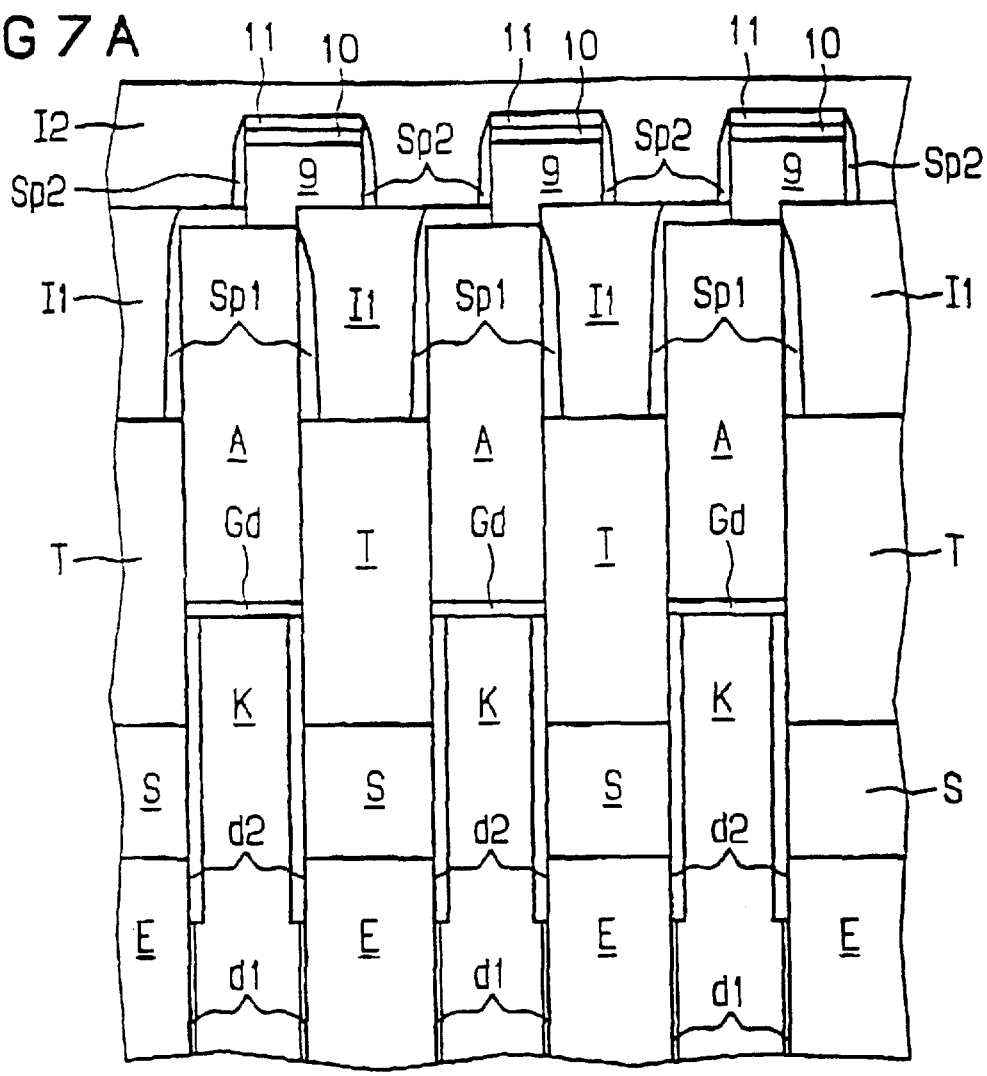
FIG. 7a shows the cross section from FIG. 1 after the process steps from FIG. 6a and after a ninth layer and a tenth layer, which form first word lines, an eleventh layer, second spacers and a second insulation have been produced.
Figure 7B:
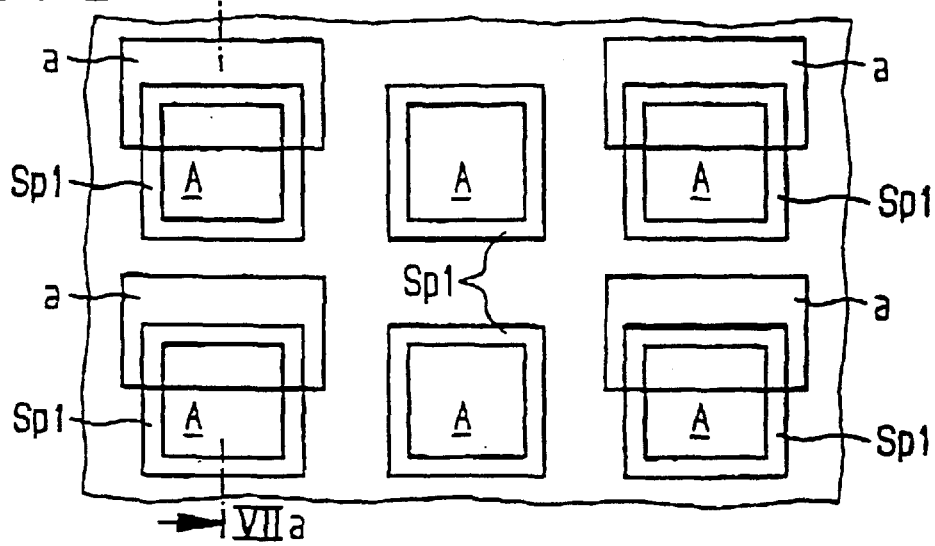
FIG. 7b shows the plan view from FIG. 2a illustrating the connection structures, the first spacers and regions which are not covered by a sixth photoresist mask.

In order to produce a second insulation I2, silicon nitride is deposited to a thickness of approximately 100 nm and planarized by chemical mechanical polishing until a plane area is produced (see FIG. 7*a*).

With the aid of a strip-shaped eighth photoresist mask P', whose strips are approximately 300 nm wide, have a distance of approximately 100 nm between one another, run transversely with respect to the isolating structures T and are arranged above connection structures A with which the first word lines make contact, silicon nitride is etched selectively with respect to $SiO_2$ and silicon using $CHF_3$, for example, until the connection structures A with which the first word lines do not make contact are partially uncovered (see FIG. 8). Second contact holes which are arranged offset oppositely to the y-direction with respect to the connection structures A are thereby produced in the second insulation I2. The second contact holes are produced in a self-aligned manner between the second parts of the first word lines since etching is effected selectively with respect to the second spacers Sp2 and with respect to the eleventh layer 11.

In order to produce second word lines, an in-situ-doped twelfth layer 12 made of polysilicon and having a thickness of approximately 60 nm is deposited and a thirteenth layer 13 made of tungsten silicide and having a thickness of approximately 50 nm is deposited over that (see FIG. 9*a*). A fourteenth layer 14 made of silicon nitride and having a thickness of approximately 50 nm is deposited over that. The second contact holes are thereby filled with conductive material, with the result that first parts of the second word lines are produced (see FIG. 9*b*). With the aid of a strip-shaped ninth photoresist mask, whose strips are approximately 100 nm wide, have a distance of approximately 100 nm between one another, run parallel to the isolating structures T and do not overlap the second contact holes, the twelfth layer 12, the thirteenth layer 13 and the fourteenth layer 14 are etched until the second insulation I2 is uncovered. As a result, second parts of the second word lines, which have a strip-shaped cross section, are produced from the twelfth layer 12 and the thirteenth layer 13 above the first word lines (see FIGS. 9*a*, 9*b*, 9*c*).

In order to produce third spacers Sp3, silicon nitride is deposited to a thickness of 18 nm and etched back, with the result that the second word lines are encapsulated by the third spacers Sp3 and the fourteenth layer 14 (see FIGS. 9*a*, 9*b*).

A DRAM cell arrangement having folded bit lines is produced in the exemplary embodiment. A memory cell comprises one of the vertical transistors and one of the capacitors, which is connected in series with the transistor, and has an area of $4F^2$, where F is 100 nm. Each memory cell is connected to one of the bit lines and to one of the first or one of the second word lines. The memory cells are arranged in columns running parallel to the y-axis y and in rows running parallel to the x-axis x, the columns running parallel to the bit lines and the rows running parallel to the word lines.

The first parts of the first word lines overlap, along the rows, each second connection structure of the connection structures A, and are arranged in each case offset in the y-direction with respect to the associated connection structure A. The first parts of the second word lines overlap the remaining connection structures A, and are arranged in each case offset oppositely to the y-direction with respect to the associated connection structure A.

Parts of the connection structures A which are arranged on the first sidewalls of the upper regions of the depressions V act as gate electrodes of the transistors.

Channel regions of the transistors are parts of the substrate S which are arranged between the upper source/drain regions S/D1 and the lower source/drain regions S/D2. The channel regions of the transistors are connected to one another, with the result that floating body effects are avoided.

There are many conceivable variations of the exemplary embodiment which likewise lie within the scope of the invention. Thus, dimensions of the layers, depressions, structures and spacers can be adapted to the respective requirements. The same applies to the dopant concentration and to the choice of materials. Thus, the word lines and bit lines may also contain different conductive materials than those referred to in the exemplary embodiment.

Having described the invention, and a preferred embodiment thereof.

What is claimed as new and secured by Letters Patent is:

1. A method for fabricating a DRAM cell arrangement,
   in which memory cells are produced in columns running parallel to a y-axis (y) and rows running parallel to an x-axis (x),
   in which a pillar-shaped connection structure (A) is in each case produced for the memory cells,
   in which bit lines are produced which are respectively connected to the memory cells of a column,
   in which a first insulating layer (6) is applied over the connection structures (A) of memory cells,
   in which first contact holes are produced in the first insulating layer (6), which uncover parts of each second connection structure (A) of the memory cells of a row in such a way that the first contact holes are arranged offset in the y-direction with respect to the connection structures (A),
   in which conductive material is deposited, with the result that the first contact holes are filled with first parts of first word lines,
   in which a second insulating layer (11) is deposited,
   in which the conductive material and the second insulating layer (11) are patterned, thereby producing strip-shaped second parts of the first word lines, which run essentially parallel to the x-axis (x), adjoin the first parts of the first word lines from above and are covered by the second insulating layer (11),
   in which sidewalls of the first word lines are provided with insulating spacers (Sp2),
   in which the first insulating layer (6) is etched selectively with respect to the second insulating layer (11) and the spacers (Sp2), with the result that parts of the remaining connection structures (A) are uncovered in such a way that second contact holes are produced, which are arranged offset oppositely to the y-direction with respect to the connection structures (A), in which conductive material is deposited, with the result that the second contact holes are filled with first parts of second word lines, which are arranged between the spacers (Sp2) of mutually adjacent first word lines, in which the conductive material is patterned, thereby producing strip-shaped second parts of the second word lines, which run essentially parallel to the x-axis (x), adjoin the first parts of the second word lines from above and are arranged above the first word lines and the bit lines.

2. The method as claimed in claim 1, in which the connection structures (A) are produced in such a way that they project above a main area (H) of a substrate (S) in which the memory cells are arranged, in which sidewalls of the connection structures (A) are provided with further insulating spacers (Sp1), in which an insulation (I1) is produced, which surrounds the connection structures (A), in which strip-shaped trenches are produced in the insulation (I1) by performing processes of masking and etching selectively with respect to the first insulating layer (6) and the spacers (Sp2) until parts of the main area (H) are uncovered, in which conductive material is deposited, with the result that the bit lines are produced in the trenches, the first parts of which bit lines adjoin the further spacers (Sp1) of connection structures (A) that are adjacent to one another in the x-direction, and have a smaller width than second parts of the bit lines which are arranged between the first parts of the bit lines.

3. The method as claimed in claim 1, in which a depression (V) is in each case produced for the memory cells, in which areas of a lower region of the depression (V) are provided with a capacitor dielectric (d1, d2) of a storage capacitor, in which a storage node (K) of the storage capacitor is produced in the lower region, in which at least a first sidewall of the depression (V) is provided with a gate dielectric (Gd) in an upper region of the depression (V), in which at least a part of the connection structure (A) is produced in the depression (V), with the result that it is suitable, on the first sidewall, as a gate electrode of a vertical transistor of the memory cell which is connected in series with the storage capacitor, and is electrically insulated from the storage node (K), in which an upper source/drain region (S/D1) of the transistor is produced on the main area (H) with the result that it adjoins two depressions (V) of the memory cells, said depressions being adjacent to one another in the x-direction.

4. The method as claimed in claim 3, in which further trenches running essentially parallel to one another are produced, in which the further trenches are filled with isolating structures (T), in which, by etching with the aid of a strip-shaped further mask (P2) whose strips run transversely with respect to the further trenches, the substrate (S) is etched selectively with respect to the isolating structures (T), with the result that the depressions (V) are produced, in which the first word lines and the second word lines are produced in such a way that they run essentially parallel to the strips of the further mask (P2), in which the bit lines are produced in such a way that they run essentially parallel to the further trenches.

5. The method as claimed in claim 3, in which, after the production of the capacitor dielectric (d1, d2), the depressions (V) are filled with conductive material up to a middle height (m), in which, with the aid of a strip-shaped mask (P3) covering the second sidewalls of the depressions (V), uncovered parts of the capacitor dielectric (d1, d2) are removed, in which the depressions (V) are filled further by conductive material up to an upper height (o), with the result that the storage nodes (K) are produced from the conductive material, said storage nodes adjoining the substrate (S) at the first sidewalls of the depressions (V), in which a lower source/drain region (S/D2) of the transistor is produced in the substrate (S), said source/drain region adjoining the storage node (K) between the middle height (m) and the upper height (o), in which the gate dielectric (Gd) is produced in such a way that it covers the storage node (K).

6. The method as claimed in claim 4, in which firstly the upper regions of the depressions (V) are produced, in which auxiliary spacers (f) are produced in the depressions (V) by depositing material and anisotropically etching it back, in which the auxiliary spacers (f) are rounded by an isotropic etching process, with the result that uncovered parts of bottoms of the depressions (V) have an essentially circular circumference, in which the lower regions of the depressions (V) are produced by anisotropic etching selectively with respect to the auxiliary spacers (f), with the result that horizontal cross sections of the lower regions of the depressions (V) are essentially circular.

7. The method as claimed in claim 4, in which a lower layer (3) made of a first material is applied on the main area (H), in which an upper layer (4) made of a second material is applied on the lower layer (3), in which the isolating structures (T) are produced in such a way that they are composed of the first material and that an upper area of the isolating structures (T) lies above the main area (H) and below an upper area of the lower layer (3), in which auxiliary structures (Q) made of the second material are produced above the isolating structures (T), in which the second material is etched until the lower layer (3) is uncovered, with the result that a part of the auxiliary structures (Q) is preserved, in which, using the further mask (P2), firstly the first material is removed selectively with respect to the second material, with the result that the upper area of the isolating structures (T) lies above the main area (H) in an unchanged manner, in which the depressions (V) are produced, the upper area of the isolating structures (T) remaining above the main area (H).

8. The method as claimed in claim 5, in which, in order to produce the lower source/drain region (S/D2), dopant is diffused from the storage node (K) into the substrate (S).

9. The method as claimed in claim 5, in which, after the production of the depressions (V), a first part (d1) of the capacitor dielectric is applied, in which the depressions (V) are filled by conductive material up to a lower height (u), in which uncovered parts of the first part (d1) of the capacitor dielectric are removed, in which a second part (d2) of the capacitor dielectric is applied, which is thicker than the first part (d1) of the capacitor dielectric.

10. A method for fabricating dynamic random access memory having a plurality of memory cells arranged in rows extending along a first direction and columns extending along a second direction, said method comprising:

forming connecting pillars for each of said memory cells;

forming a bit line, said bit line to be connected to memory cells belonging to one of said columns;

applying a first insulating layer over said connecting pillars;

forming a first row of contact holes in said first insulating layer, said first row of contact holes being disposed above a first plurality of connecting pillars from a corresponding row of connecting pillars and offset therefrom in a first offset direction parallel to said second direction, depositing conductive material in said contact holes of said first row of contact holes, thereby forming a first part of a first word line;

depositing a second insulating layer;

patterning said conductive material and said second insulating layer to form a strip-shaped second part of said first word line, said strip-shaped second part extending substantially parallel to said first direction and adjoining said first part of said first word line from above;

providing insulating spacers on sidewalls of said first word line;

forming a second row of contact holes by selectively etching said first insulating layer, said second row of contact holes being disposed above a second plurality of connecting pillars from said corresponding row of connecting pillars and offset therefrom in a second offset direction opposite said first offset direction;

depositing further conductive material in said contact holes of said second row of contact holes, thereby forming a first part of a second word line; and patterning said further conductive material to form a strip-shaped second part of said second word line, said strip-shaped second part being disposed above said first word line and said bit line, extending substantially parallel in said first direction and adjoining said first part of said second word line from above.

11. The method of claim 10, wherein forming connecting pillars comprises forming first and connecting pillars adjacent to each other in said first direction, each of said first and second connecting pillars projecting above said main area of said substrate, thereby exposing sidewalls of said connecting pillars, and coating said sidewalls with further insulating spacers; and surrounding said connecting pillars with insulation;

forming strip-shaped trenches in said insulation;

depositing conductive material to form bit lines in said strip-shaped trenches, said bit lines having first parts adjoining said further insulating spacers, and second parts disposed between said first parts, said second parts having a width that is greater than said first parts.

12. The method of claim 10, further comprising forming a depression in said substrate, said depression;

forming a storage capacitor in said depression;

forming a vertical transistor disposed above said storage capacitor, said vertical transistor being in series with said storage capacitor.

13. The method of claim 12, wherein forming said storage capacitor comprises:

providing a capacitor dielectric of a storage capacitor in a lower region of said depression; and providing a storage node of said storage capacitor in said lower region of said depression.

14. The method of claim 12, wherein forming a vertical transistor comprises:

providing a gate dielectric in said sidewall in an upper region of said depression; and forming at least a portion of said connecting pillar in said depression, said connecting pillar being insulated from said storage node and configured as a gate electrode of said vertical transistor.

* * * * *